United States Patent [19]

Nosowicz et al.

[11] 4,153,950

[45] May 8, 1979

[54] DATA BIT ASSEMBLER

[75] Inventors: Eugene J. Nosowicz, Vestal; Robert C. Pearson, Newark Valley, both of N.Y.

[73] Assignee: International Business Machines Corp., Armonk, N.Y.

[21] Appl. No.: 926,679

[22] Filed: Jul. 21, 1978

[51] Int. Cl.² ............................................. G11C 13/00
[52] U.S. Cl. ..................................... 365/231; 340/789
[58] Field of Search ................. 365/45, 189, 244, 231; 340/324 R, 324 M

[56] References Cited

U.S. PATENT DOCUMENTS 3,940,747  2/1976  Kuo .................................. 365/231

Primary Examiner—Terrell W. Fears
Attorney, Agent, or Firm—Kenneth P. Johnson

[57] ABSTRACT

Apparatus for assembling binary data bits in parallel by groups in variable, selected locations in a shift register for subsequent serial readout. One or more shift registers are arranged in a matrix of rows and columns of storage cells and addressed along one coordinate while a plurality of data are applied in parallel along the orthogonal. Selector circuits are controlled to selectively shift a data word to enable the first bit in the word to be stored in any storage position within the addressed coordinate, with each remaining bit in the word stored in a correspondingly contiguous storage position in the matrix. Bit storage cells of the shift registers are of the set-reset latch type so that once set they cannot be changed by subsequent data bits until the entire array is reset. This enables the overwriting of successive data bytes.

11 Claims, 3 Drawing Figures

DATA BIT ASSEMBLER

BACKGROUND OF THE INVENTION

This invention relates generally to data storage and retrieval and more particularly to shift registers having data stored at selective locations in parallel and then read out serially.

Matrix printers compose records or characters by recording discrete bits or fragments at appropriate locations. Examples of these are ink jet, laser, electroerosion, electrolytic or wire printers. These machines require a large number of digital control and data signals, since each recorded mark requires a data bit of information and various clocking and gating pulses. Data manipulation and transmission become even more difficult and complex for the higher quality of printers which use greater pel densities (print elements per unit area) or for high recording rates.

In some matrix printers, particularly certain ink jet types, the linear array of marking devices has a length that is sufficient to simultaneously record the equivalent of several print lines during a single sweep of the print head across the recording medium. This relatively wide marking band permits the recording of marks or characters at nearly any point within the length of the array. Assuming that the print head moves relative to the recording medium in the conventional sense, printing may occur at different numbers of lines per inch or even be controlled to record non-constrained graphics. Characters do not necessarily appear in a fixed vertical location even for a given standard format. The character position differences must be provided for in accommodating upper and lower case lettering, subscripts and superscripts, and overstruck characters. That is to say, a character must be able to be placed anywhere within the vertical recording band of the print head during its movement. The actual position of the character will be defined by some base line or starting address.

The information which describes a character to be printed is contained in a unit usually identified as a character generator. The character generator contains all of the bytes of binary data required for each character to be printed and may contain the characters of multiple fonts and special characters. If the data for each character are envisioned as being a matrix of binary bits in which each column is a byte or plurality of data bits, and several characters are to be printed concurrently, then it will be seen that many bytes of data are retrieved from the character generator to supply data for a single column of marks to the print head. Each marking device can then be controlled as to whether it will produce a mark. Data bytes for each character are usually not retrieved from the character generator in the vertical order of appearance to fill the control latches for the marking devices, and must be rearranged to appear at the proper position at the time printing occurs. Therefore, the data bytes must be rearranged and placed in the proper latches for the instant of printing.

Heretofore, when character generator data has been retrieved, it has either been on a fixed base line for each print line or the preliminary organization has required extensive transfer of data into temporary or patch buffers to permit orderly withdrawal in sequence. The previous techniques have required complex and expensive circuits, and greater transfer time for transmitting each quantum of recording data since data has been transferred serially.

OBJECTS AND SUMMARY OF THE INVENTION

Accordingly, it is a primary object of this invention to provide data bit assembler apparatus capable of storing data bits in parallel for retrieval serially in an order different from that when received for storage and which can be readily fabricated with integrated circuit technology.

A further object of this invention is to provide data bit assembler apparatus in which data contained in parallel words can be stored in parallel as subgroups thereof in selected locations in a shift register for subsequent serial retrieval.

Another object of this invention is to provide data bit assembler apparatus having one or more shift registers arranged as a matrix of rows and columns and addressable to store data bits in parallel by subgroups of data bits of a data byte for subsequent serial readout.

A still further object of this invention is to provide data bit assembler apparatus in which data received in parallel bytes can be stored in parallel as subgroups thereof at selected locations in a shift register for subsequent serial retrieval and in which each data byte can be shifted to permit initial storage at any position within a subgroup.

Yet another object of this invention is to provide data bit assembler apparatus in which data presented as a plurality of data bytes can be stored in parallel subgroups smaller than a byte at selected locations in a shift register for subsequent serial readout and in which the storage cells of the shift register can be recorded a plurality of times between resets of the array without altering previously stored data.

The foregoing objects are attained in accordance with the invention by arranging one or more shift registers so as to be addressable in a matrix of row and columns of the storage cells for storing data bits therein. Data bits to be stored for printing are received in parallel sequential bytes at a buffer register. A plurality of buffer stages are gated to the matrix cells along one coordinate such as the columns and the stages are grouped according to the number of matrix columns desired in a subgroup of data. The buffer stages of a subgroup are selectively gated to the columns in parallel and are stored in the cells of an addressed, common orthogonal row. The buffer register has a number of surplus stages that is one less than the number of columns to enable shifting of the received data byte and permit the initial subgroup of the byte to be stored at any selected column.

Data stored as successive subgroups in the matrix-arranged shift registers are read out serially from each register to a set of output latches each corresponding to one of the marking devices to control recordation of a mark corresponding thereto. During storage of the subgroups in the matrix arrangement, the rows may be addressed by incrementing or decrementing from the starting row or otherwise controlled to store the data subgroup at any other row in the matrix. The storage cells of the shift registers are of the set-reset type in which each cell can be set to indicate a stored bit but cannot be changed until the entire array is reset. This permits the overwriting of data by a subsequent byte or word and only those cells not previously set can be so set if a data bit is present. The disclosed arrangement permits the selection of a starting base line for each line of print as desired regardless of the sequence in which character data are received from the character generators. As a result, a wide range of format selection is available in the recording of data.

DESCRIPTION OF THE PREFERRED EMBODIMENT

Figure 1:
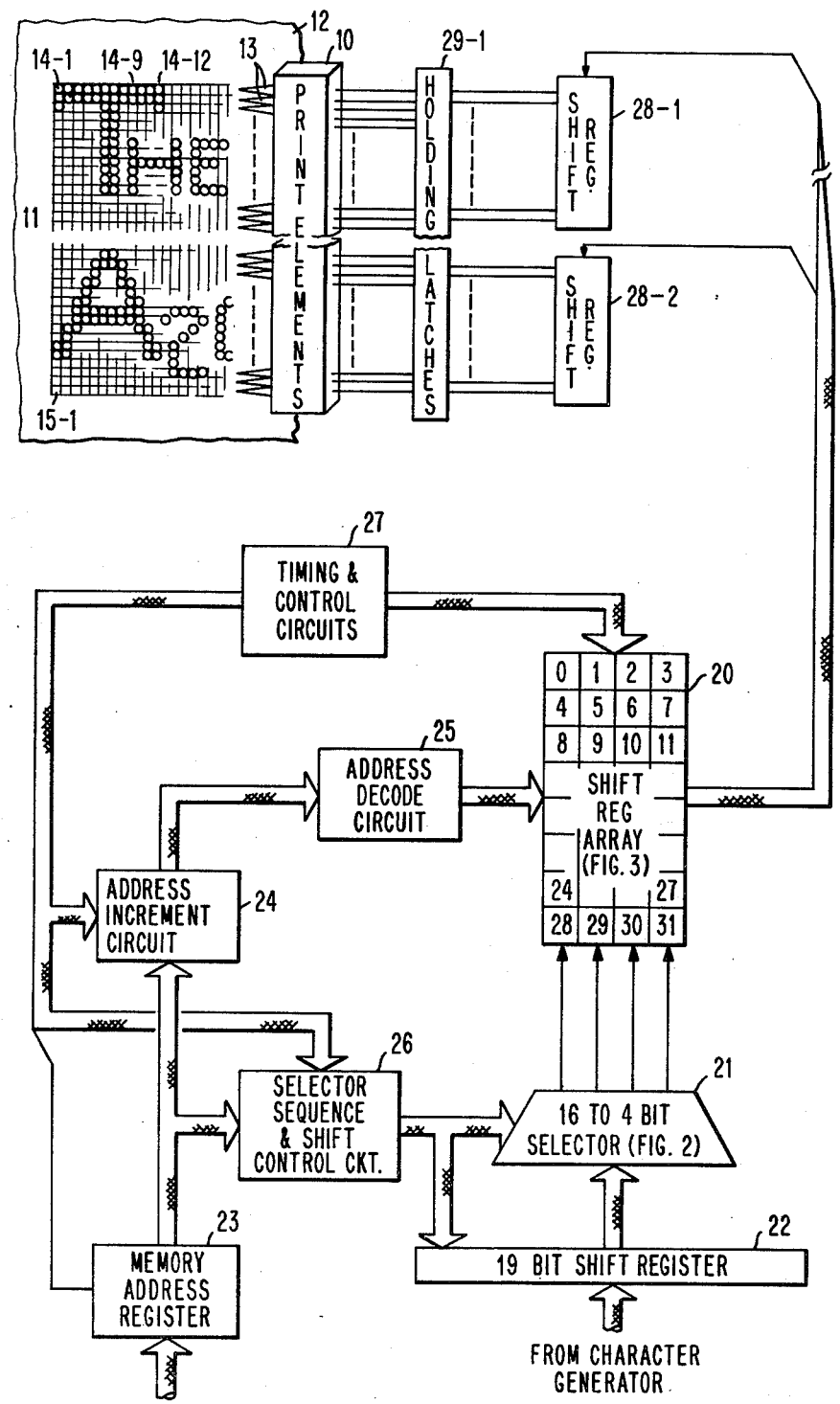
FIG. 1 shows the overall system of the invention.

Referring to FIG. 1, print head 10 is controlled to compose recorded characters 11 as a plurality of selectively generated and located marks during relative motion between the head and recording medium 12. An ink jet printer is used in this illustration in which the print elements are shown as a plurality or bank of nozzles 13 schematically indicated. Although not shown in detail, such a print head usually has one or more rows of nozzles from each of which drops are continuously emitted toward the recording surface but are deflected and intercepted by gutters to prevent the ink from reaching the record surface. When a mark is to be recorded, a charge ring at a nozzle has a potential removed therefrom which fails to induce a charge on one or more drops which will then travel to the record surface. At other times the drops are charged by the charge ring potential and attracted by electrostatic deflection electrodes to impact the gutter. Thus, the actual printing control is in the signals applied to the charge electrodes for each nozzle in order to compose the character. Likewise, in other matrical printing devices the electrical signals may be used to control the recording of a character element in similar fashion such as activating an impact wire, unblanking a light beam, or eroding or altering the color of the record surface with a current pulse.

The characters are composed from binary data bytes which are retrieved from a character generator and appropriately applied ultimately to the printing elements or nozzle charge rings to control the marking. During recording, the band covered by nozzle bank of print head 10 is of sufficient width to concurrently record a plurality of print lines across the record surface during each pass. As a result, data for a vertical portion of each character must be retrieved from the character generator at a plurality of locations and assembled for the recording of a single column of drops at appropriate locations. As seen from the superimposed grid in the figure, each character is made up of a plurality of vertical bytes of data with each byte containing a binary notation such as a "1" bit indicating the recording of a mark by a nozzle.

Depending on the length of the nozzle bank, several data words or bytes of data may be necessary for printing a single vertical column along the extent of the print head bank. These bytes are retrieved in succession from different sections of the character generator during the interval between recorded columns of marks and supplied to the head as charge controlling signals. In the illustration of FIG. 1, the print head is indicated as including 32 nozzles or those adequate for two 16-bit bytes of data. As suggested in the figure, additional nozzles and corresponding circuits can be provided for larger print heads. In the illustrated embodiment, the first or leftmost drop column requires two 16-bit bytes with the upper byte 14-1 containing three "1" bits for the "T" and the lower byte 15-1 containing two data bits for the leftmost side of the "A". These bytes are each retrieved from storage, not shown, and assembled for transmission to the nozzle charge electrodes.

In the character arrangement printed, at least two bytes are necessary for recovery for each column of rightward progression of the print head along the recording surface. In the case of overprinting, as will be discussed later, one or more extra bytes must be retrieved. This invention is concerned with the assembly of retrieved data bytes and their organization for presentation to the print elements or charge electrodes. Character selection and data retrieval from a character generator is not part of the invention and is not further described.

The data assembly apparatus of the invention comprises a bit assembler which is a shift register matrix array 20 including a plurality of shift registers arranged in rows and columns of binary data bit storage cells, a bit selector 21 for supplying data byte subgroups to the bit assembler along the columns of the array, a nineteen bit shift register 22 for supplying data to the bit selector, a memory address register 23 for specifying the array address in which the bit subgroups are to be recorded, an address incrementing circuit 24 for changing the array address, an address decode circuit 25 for gating the selected array rows, a selector sequence and shift control circuit 26 for shifting the retrieved data byte and selecting the desired subgroups, and timing and control circuits 27 for gating the shift register array.

Figure 2:
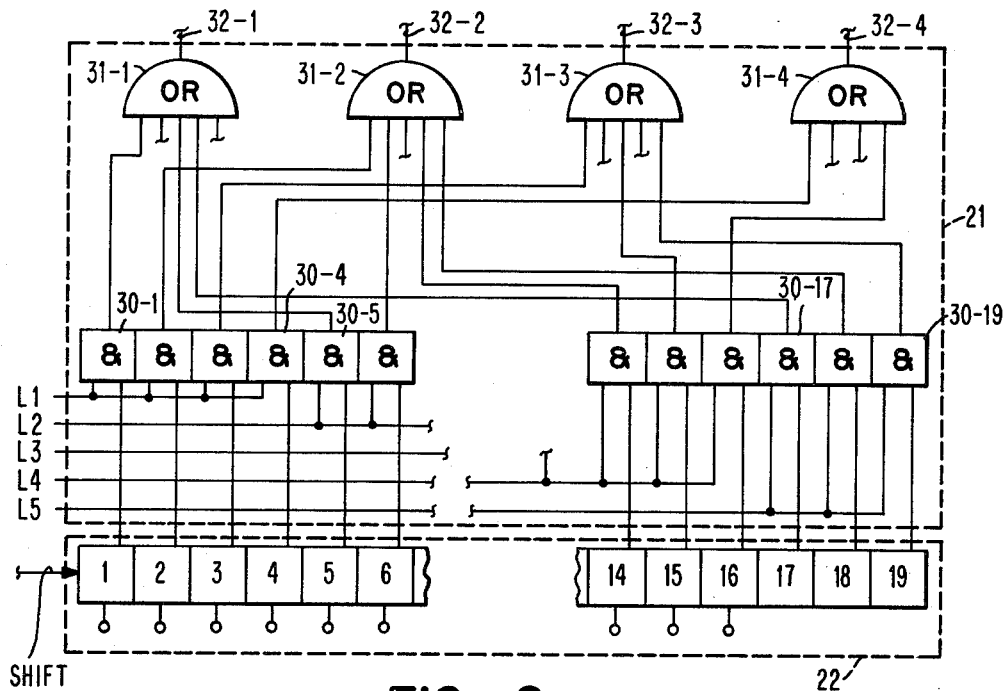
FIG. 2 illustrates the selection circuitry to be used in the system of FIG. 1 and, FIG. 3 illustrates the storage matrix to be used in the system.

Shift register array 20 comprises a plurality of shift registers, of which two are shown, each having sixteen bit storage cells writable in parallel groups, with each shift register being operable by clock pulses to serially read out its data to a respective serial-to-parallel shift register 28-1 or 28-2 at the print head. From there the data are transmitted to respective groups of holding latches 29-1 and 29-2 for the charge electrode drivers. The shift register stages in the bit assembler array 20 are arranged in a matrix of rows and columns of cells with each row having four cells therein and connected in sequence shown. Each shift register in the array 20 is grouped for writing as rows of four. The bit storage cells comprising a column in the shift register array are each commonly connected to an output line from the 16 to 4 bit selector 21. However, data can be recorded in these storage cells from the bit selector only when a cell row such as cells 0-3 or 4-7 are gated by address decode circuit 25. Data bytes for storage within array 20 are retrieved from a character generator or other source and transmitted first to the 19-bit shift register 22 as a succession of single bytes. Each byte is then transferred in parallel to bit selector 21 which is shown in greater detail in FIG. 2.

The ability to selectively record a character or other mark at any location within the dimension of the print head is highly desirable and thus makes all points of the recording surface addressable for marking. The present invention provides this capability through the 19 bit shift register 22, the bit selector 21, and shift register array 20. A data byte retrieved from the character generator is transmitted in parallel to the first 16 bit positions of the 19 bit shift register 22 in FIG. 2. At the time of transmission, a 7 bit address which may be called the bit assembler line address, is loaded into memory address register 23. The two low order binary bits of this address are used to align data to the array columns. The five high order binary bits are used to select the array row in which the column bits are to be stored.

A data byte appearing on the cable from the character generator is stored temporarily in the first 16 stages of shift register 22, each corresponding to one bit position of the byte. The output of each of these stages is connected to AND gates 30-1 through 30-19. These gates are conditioned by load lines L1 through L5 in groups of four, except for L5 which conditions only the last three stages of register 22. The outputs of the first four AND gates 30-1 through 30-4 are each connected to a respective OR circuit 31-1, 31-2, 31-3, and 31-4. The second group of four AND gates are connected to the same OR circuits, again in consecutive order with AND gate 30-5 being connected to OR 31-1 and gate 30-6 being connected to OR 31-2 and so on.

In the case of the last three stages from register 22, AND gates 30-17 through 30-19 are connected through OR circuits 31-1 through 31-3. If the stored byte in register 22 does not have to be shifted, load lines L1 through L5 are sequentially energized to transmit the bits from the register stages through the AND gates and OR gates to the columns of storage cells at the shift register array 20 connected at the outputs 32-1 through 32-4 of the respective OR circuits. If stages 17, 18 and 19 of selector 22 are not set, no data will be transferred at time L5, of course. In order to permit the data byte in register 22 to be stored at any position in the shift register, it is controlled by the two low order bits of the memory address from circuit 23 through shift control circuit 26. These two bits can provide for the initial bit of the data byte register 22 to be started at any one of four columns. If the two lower order bits are both zero, no shifting will occur before the load lines L1-L5 are sequentially energized. If the two lower bits are other than zero, a shift is performed to align the data with the selector. These data must be shifted right the binary equivalent of the two low order bits, for example, for bits 0,1, a single shift is required, for a 1,0 a double shift is required, and for a 1,1 triple shift occurs. Once the shifting is done, the normal loading of the array occurs.

The desired row of the shift register array in FIG. 1 is selected from the five high order bits of the memory address circuit 23. These five bits gate the selected row of memory cells in array 20 through address increment circuit 24 and decoding circuit 25. This memory address thus conditions the selected row of four cells to be set according to the data in the four bit positions of the stages in register 22 when corresponding load lines L1-L5 are sequentially energized.

For example, when load line L1 is energized, the first four bits can be placed in the fourth row, if desired, and thereafter address increment circuit 24 will alter the row address by 1 in succession for each energization of the remaining load lines L2-L5. The address incrementing circuit 24 is preferably set to "roll over" into the beginning rows of the array when the addressing reaches the last row of the array. Timing and control circuits 27 control the incrementing of the address and the application of the gating pulses into various memory cells in the array.

Shift register array 20 has been shown as including at least two shift registers, each having sixteen memory cells. The first register has cells 0 through 15 and the second has cells 16 through 30. In the foregoing discussion, the data bytes have been contemplated as having 16 binary bits therein but other word or byte lengths can be used. The number of memory cells in each array shift register is optional, of course. It will be seen from the foregoing that a data byte can be recorded in the memory cells at any position as desired and thereby provide a base line address in any position along the length of the print head.

After the data have been stored in register array 20, timing and control circuits 27 are operable to read out the several shift registers comprising the array. In this case, shift pulses are applied to the two registers simultaneously and the data are read out serially from each of the two shift registers concurrently and into shift registers 28-1 and 28-2. Thereafter, the latter two shift registers are gated to read the stored bits in parallel into the holding latches which are operable to energize the charge rings appropriately for the recording of marks by nozzles 13.

Figure 3:
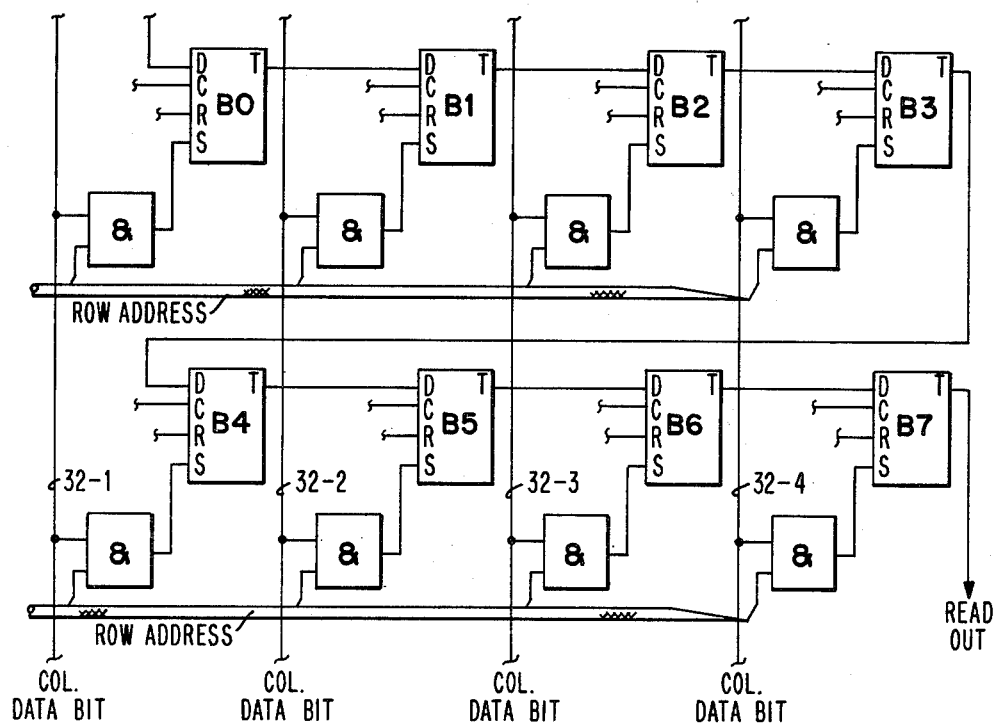

In FIG. 3, there is shown an arrangement of bit storage cells for use with the shift register array in FIG. 1. Only two rows of the matrix are shown and are representative of the remainder of the cells. These storage cells B0 through B7 may be well-known edge-triggered shift latches with optional set (S) or reset (R) capability. With the set and reset lines at the inactive logical state (logical 0) the latch is controlled by the clock (C) and data (D) lines. When the clock line makes a transition from the inactive state to the active state (logical 1) the logical value of the data line is transferred to the true output terminal. The logical complement of the data line is transferred to the complement output terminal simultaneously. The transfer from the data input to the output occurs only when the clock input makes a transition. Once the transition is made, the output terminals remain at the values attained during the most recent clock transition unless acted upon by the set or reset inputs or a later clock transition.

When the set input is raised to the active state, the true output is forced to a logical 1 and the complement to a logical 0. The clock is disabled until the set input is placed at the inactive state. Once the latch has been set and the set input returned to the inactive state, the latch remains in the set state until altered by another combination of inputs. Reset causes the true output to become a logical 0, and the complement to become a logical 1 when raised to the active state. The reset also overrides the clock signals and simultaneous setting and resetting are not permitted.

During normal loading of the shift register, the array is reset at the beginning of the load cycle using the reset line of all array cells which are commonly connected. The array is then loaded by manipulating the set lines through the interaction of the data bit and address lines. When loading is complete, the shift clock is activated and for each transition of the shift clock the data moves one position in the shift register. The shifting thereafter proceeds until all data are transferred out.

The invention provides the further capability of overlaying characters in which one character can be superimposed over another on the record surface. This is done without backspacing and overstriking or providing a storage space for the special character configuration. Since shift register array 20 uses latches that cannot be changed to a 0 from a logical 1 except by total array reset, data bytes from two characters in a character generator can be stored in sequence in the array and only those cells which are to signify data bits are set. This technique is used to make up the data byte shown for the recorded data bytes of 14-9 through 14-12 in FIG. 1 in which portions of the "H" are recorded concurrently with the top bar of the "T". The data bytes from the "T" and the "H" are written in common rows of cells within the shift register array 20 prior to transmission of those rows to shift registers 28 and holding latches 29. This ability is commonly desired when superimposing characters over horizontal or vertical lines which may extend the full length of the data byte.

Although the invention has been described with a pair of shift registers in the bit assembler array 20, other numbers of shift registers can be used and the numbers of cells in the rows and columns can be varied to suit the marking requirements. As is evident from above, the placement of data within the array is not dictated by the shift register length and the boundaries need not be restrictive in the placement of marking data. The circuit arrangements lend themselves to large scale integration to facilitate high speed data transfer and inexpensive construction. The necessity of providing readout addressing from the array has been eliminated thus reducing the complexity heretofore experienced.

In the foregoing, a "1" bit has been assumed to indicate a mark on the recording surface. In fact, the designation of a "0" or "1" as designation of a mark is optional with the invention.

While the invention has been particularly shown and described with reference to preferred embodiments thereof, it will be understood by those skilled in the art that the foregoing and other changes in form and details may be made therein without departing from the spirit and scope of the invention.

Having thus described by invention, what I claim as new, and desire to secure by Letters Patent is:

1. In a printer having a plurality of marking means each selectable by a control signal for recording a mark, apparatus for supplying said control signals comprising:
   data bit assembler means having a plurality of storage cells, each corresponding to a said marking means, said cells being arranged in a matrix of rows and columns and addressable by rows for selective parallel storage of said data bits in the cells within a row, said plurality of cells being activatable for serial readout of data within each said row and said rows being readable in succession;
   buffer means having a plurality of storage positions for receiving in parallel a plurality of said data bits;
   buffer readout means connected between said cell columns and said buffer storage positions for applying thereto in parallel a predetermined group of bits in said plurality;
   means for addressing predetermined rows for successively storing groups of bits appearing at said columns of cells; and
   means for serially reading out the data bits within a said row and sequentially from said rows as control signals for respective ones of said marking means.

2. Apparatus as described in claim 1 wherein said data assembler means includes a plurality of shift registers each operable for serial readout of data bits therein.

3. Apparatus as described in claim 1 wherein each of said rows of cells is addressable with groups of said data bits a plurality of times prior to the reading out of said rows.

4. Apparatus as described in claim 2 wherein the shift registers in said array are read out concurrently to respective groups of said marking means.

5. Apparatus as described in claim 4 wherein said marking means includes supplemental storage means for the data bits read out from said shift registers in said array.

6. Apparatus as described in claim 1 wherein said buffer storage means includes means for shifting said parallel plurality of data bits at least one column with respect to said assembler means.

7. Apparatus as described in claim 1 wherein said buffer means includes means for shifting bit plurality of data bits a number of stages one less than the number of columns in said assembler means.

8. An arrangement for printing characters at varying positions comprising:
   a series of marking means;
   bit assembler means having a plurality of bit storage cells, each corresponding to a said marking means, said cells being arranged in rows and columns and addressable by rows for parallel storage of successive groups of data bits therein, with each bit position in a said group corresponding to a said column and activatable for serial readout of said storage bits in said columns of cells in a plurality of rows;
   buffer storage means connected to said bit assembler for receiving in parallel the bits from a byte of character data and including means for serially shifting said byte;
   control means operable for selectively transferring groups of said bit data from said buffer means to said bit assembler columns;
   address means operable to select a row of said cells in said bit assembler for storage of a said data group;
   address incrementing means for changing said address to successive rows of said cells for storing additional groups of bits from said buffer storage means until said data byte has been completely stored; and
   means for transferring said data bits to said marking means serially from the column positions in a row and from a plurality of said rows.

9. Apparatus as described in claim 8 wherein said buffer storage means includes means for shifting said data byte a number of positions one less than the number of columns in said bit assembler.

10. Apparatus as described in claim 8 wherein said address incrementing means is operable to increment said address a number of times equal to the number of groups of data in said data byte.

11. Apparatus as described in claim 8 wherein said bit assembler includes a matrix of binary storage cells, each settable from a reset state to a set state only when data is present for storage irrespective of the number of times said cells are addressed.

* * * * *